United States Patent [19]

Yamatsu

[11] Patent Number: 4,786,867
[45] Date of Patent: Nov. 22, 1988

[54] WAFER PROBER

[75] Inventor: Yasuyoshi Yamatsu, Yokohama, Japan

[73] Assignee: Canon Kabushiki Kaisha, Tokyo, Japan

[21] Appl. No.: 91,907

[22] Filed: Sep. 1, 1987

[30] Foreign Application Priority Data

Sep. 2, 1986 [JP] Japan .............................. 61-205146

[51] Int. Cl.$^4$ .................. C01R 1/06; H04N 7/00; H01L 21/66
[52] U.S. Cl. ................ 324/158 F; 324/73 PC; 358/107; 356/401
[58] Field of Search ........... 324/158 F, 158 P, 73 PC, 324/158 D; 437/8; 356/400, 401; 358/101, 106, 107

[56] References Cited

U.S. PATENT DOCUMENTS 4,301,470 11/1981 Pagany ........................ 358/101 X
4,418,467 12/1983 Iwai ........................... 356/401
4,677,474 6/1987 Sato et al. ................. 324/158 P Primary Examiner—Reinhard J. Eisenzopf
Assistant Examiner—Vinh P. Nguyen
Attorney, Agent, or Firm—Fitzpatrick, Cella, Harper & Scinto

[57] ABSTRACT

A wafer prober for use in the examination of electric characteristics of semiconductor chips formed on a semiconductor wafer is disclosed. Foe examination, probing needles provided on a probe card are press-contacted to electrode pads of an individual chip. Prior to the examination, the probing needles are press-contacted to a non-chip region of the wafer, in which portion no chip is formed, so that traces of tips of the probing needles are formed on this non-chip region. The positional relation between the traces of the needle tips and the electrode pads is detected and, on the basis of the detection, the probing needles are relatively aligned with the electrode pads. Thus, the alignment of the probing needles and the electrode pads can be made fully automatically. In another aspect, by the formation of the traces of the needle tips, the measurement necessary for the alignment can be made easily and accurately, with the result that the alignment can be made efficiently. Also, during the needle alignment, any chip on the wafer is not damaged.

8 Claims, 3 Drawing Sheets

WAFER PROBER

FIELD OF THE INVENTION AND RELATED ART

This invention relates to a probing apparatus and, more particularly, to a wafer prober usable in the manufacture of semiconductor devices, for examination of the electrical characteristics of each semiconductor device formed on a wafer.

In the field of manufacture of semiconductor devices such as integrated circuits (ICs) and during one of the final stages of the manufacture, examination is usually made of the electrical characteristics of each individual semiconductor device simply called a "chip" or "IC chip", formed on a silicon or semiconductive wafer. Such examination is normally effected prior to cutting the wafer to divide the same into respective IC chips. For this examination, a testing machine, called an "IC tester", and a probing apparatus called a "wafer prober", are used in combination. The examination itself is actually carried out by the IC tester, but the wafer prober is used in order to establish an electrical connection between the IC tester and each IC chip on the wafer.

In the wafer prober, as is well known in the art, different types of probe cards each having a plurality of probing needles are interchangeably used. In the probing operation using a particular probe card, the probing needles (more specifically the tips of the probing needles) of the probe card are press-contacted to predetermined portions (called "bonding pads" or "electrode pads") of an individual chip on the wafer, whereby the electric characteristics of this chip can be examined with the aid of the IC tester. Since the locations of such electrode pads are variable, depending on the type of the semiconductor device to be fabricated, it is necessary to prepare different types of probe cards in accordance with the types of semiconductor chips (or the types of the semiconductor wafers) to be tested. Namely, for a particular type of semiconductor chip (or wafer), a particular type of probe card whose probing needles have their needle tips arranged in accordance with the locations of the electrode pads of the particular type semiconductor chip (or wafer). Further, it is necessary to change probe cards each time a different type of semiconductor chip (or wafer) is going to be tested.

When a probe card is newly introduced into the wafer prober for the examination of corresponding chips on a wafer, it is necessary to align the probe card so that a correct positional relation is established between the probing needles (needle tips) of the newly introduced probe card and the electrode pads of first chip (or wafter to be tested prior to the start of the probing operation. This alignment should be made in order that the needle tips are correctly press-contacted to the electrode pads in the probing operation. Conventionally, such positional adjustment or alignment is made manually by an operation using the wafer prober. Since such alignment operation for aligning the probe card with respect to the electrode pads has to be effected each time a probe card is replaced, a high examination efficiency can not be attained. Also, the accuracy of alignment between the probing needles and the electrode pads depends directly upon the skill of the operator who handles the wafer prober.

SUMMARY OF THE INVENTION

The present invention has been made particularly in consideration of the above-described inconveniences, and accordingly it is a primary object of the present invention to provide a wafer prober which, at the time of replacement of probe cards, can automatically align the probing needles of a newly introduced probe card and the electrode pads of a chip to be tested.

It is another object of the present invention to provide a wafer prober by which the examination efficiency can be improved.

It is a further object of the present invention to provide a wafer prober in which probing needles of a probe card and electrode pads of each chip to be tested can be aligned with each other stably and accurately.

Briefly, in accordance with one preferred form of the present invention, to achieve these objects, the probing needles (more particularly, the needle tips) of a probe card are press-contacted to a non-chip forming portion of a wafer, in the neighborhood of a chip forming portion thereof, so as to form traces or marks of the needle tips in this portion. Then, the relative position of the traces or marks of the needle tips and the electrode pads of a chip is measured and, in accordance with the result of measurement, the probing needles and the electrode pads are relatively aligned.

It is a yet further object of the present invention to provide a wafer prober in which chips on a wafer are not damaged at the time of measurement for aligning probing needles of a probe card and electrode pads of a chip on the wafer.

In accordance with another aspect of the present invention, to achieve this object, the traces or marks of the needle tips are formed in a portion of the wafer, other than the chip forming portion thereof.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
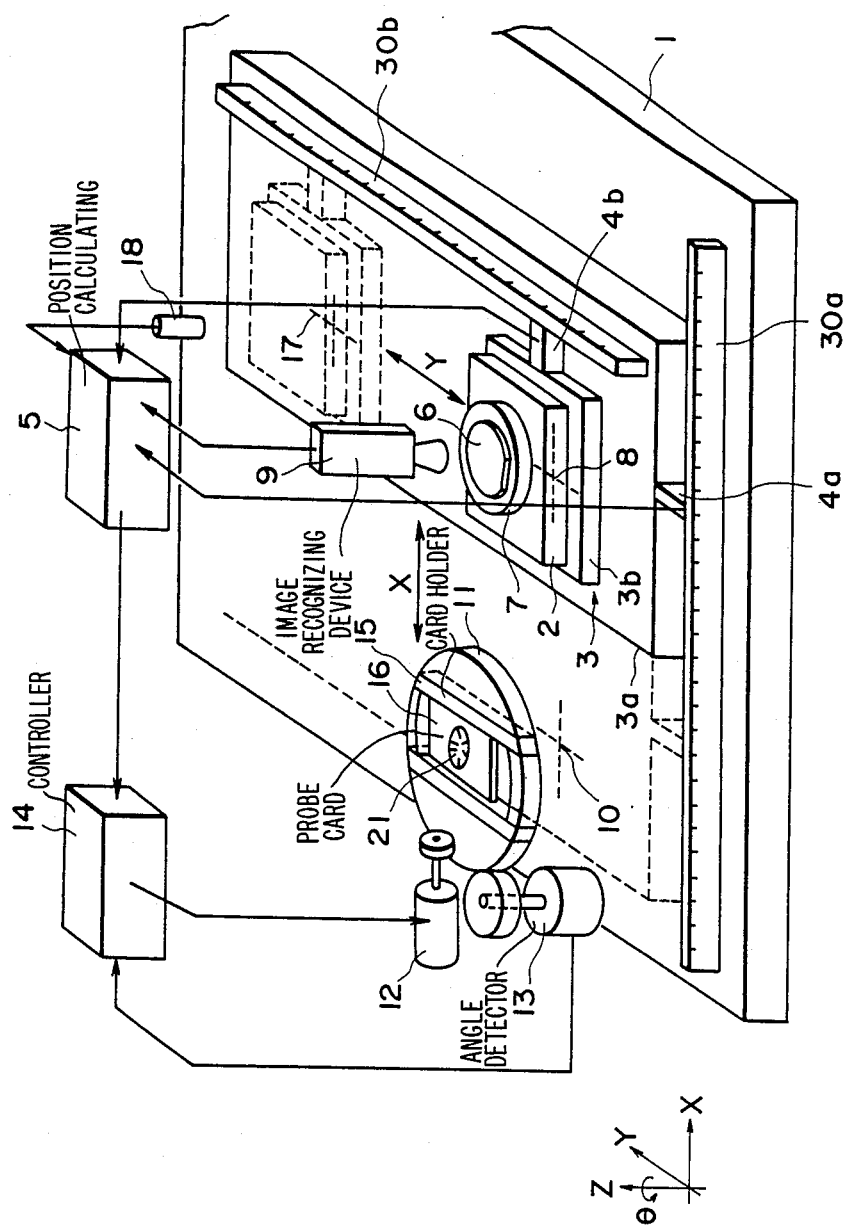
FIG. 1 is a perspective view schematically showing a wafer prober according to one embodiment of the present invention.

Referring first to FIG. 1, there is shown a wafer prober according to an embodiment of the present invention. The prober includes a base table 1 on which an X-Y stage 3 is mounted for movement in each of X and Y directions. The X-Y stage 3 supports thereon a θ-Z stage 2 so as to move the same to a desired position with respect to the X and Y directions. The X-Y stage 3 comprises an X table 3a which is movable in the X direction relative to the base table 1, and a Y table 3b which is movable in the Y direction relative to the X table 3a. The position of the X-Y stage 3 with respect to the X and Y directions can be detected by means of position detectors 4a and 4b which are cooperable with scales 30a and 30b, respectively, provided along the X and Y directions, respectively. Output signals of these position detectors 4a and 4b, representing the detected position of the X-Y stage 3, are supplied into a position calculator 5. Of these position detectors, the position detector 4a is mounted on the X table 3a so that it is movable relative to the scale 30a (which is mounted on the base plate 1) with the movement of the X table 3a. As the position detector 4a moves relative to the scale 30a, it produces output signals corresponding to the graduations of the scale 30a. Similarly, the other position detector 4b is mounted on the Y table 3b so that it is movable relative to the scale 30b (which is fixedly provided on the X table 3a) with the movement of the Y table 3b. During such relative movement, the position detector 3b produces output signals corresponding to the graduations of the scale 30b.

Disposed on the θ-Z stage 2 is a vacuum chuck 7 which is operable to hold a wafer 6 by vacuum suction. The θ-Z stage 2 is operable to move the chuck 7 in a rotational (θ) direction and in a vertical (Z) direction.

Denoted at 8 in FIG. 1 is an image recognizing position which is defined with respect to the X-Y coordinates on the base table 1. Above the image recognizing position 8, there is provided an image recognizing device 9 which comprises an objective lens and an image pickup means (such as, CCD image sensor, an image pickup tube or otherwise) for picking up an image formed by the objective lens. The image recognizing device 9 has an image pickup field (viewfield) whose center corresponds to the image recognizing position 8 with respect to the X-Y coordinates. As will be described later in detail, a wafer 6 having formed thereon traces or marks from the tips of probing needles of a probe card is conveyed to the image recognizing position 8 underneath the image recognizing device 9 by means of the X-Y stage 3. Then, the positions of these traces from the tips with respect to the X-Y coordinates are detected by the image recognizing device 9, and the obtained positional data is supplied to the position calculator 5.

Denoted at 10 in FIG. 1 is a probe test position which is defined with respect to the X-Y coordinates on the base table 1. For example, the probe test position 10 is spaced from the image recognizing position 8 by a distance L1 along the X direction. Above the probe test position 10, there is provided a rotatable probe ring 11 whose center of rotation is coincident, with respect to the X-Y coordinates, with the probe test position 10. The probe ring 11 is rotationally driven in the θ direction by means of a driving motor 12. The angle of rotation of the probe ring 11 is detected by a detector 13. Output signals of the detector 13 representing the detected rotational angle of the probe ring are supplied into a controller 14. To this controller 14, an output signal of the position calculator 5 is also supplied, and the controller 14 controls the rotational movement of the probe ring 11 by way of the driving motor 12. A card holder 15 is mounted on the probe ring 11. To this card holder 15, a probe card 16 is detachably mounted. Probing needles of the probe card 16 are denoted generally at 21 in FIG. 1.

Denoted at 17 in FIG. 1 is a prealignment position which is defined with respect to the X-Y coordinates on the base table 1. For example, the prealignment position 17 is spaced from the image recognizing position 8 by a distance L2 along the Y direction. Above the prealignment position 17, there is provided a position detecting device 18. The position detecting device 18 may be of any known type and may comprise an electrostatic capacitance type sensor whose output is variable in accordance with the distance, in the Z direction, to the wafer 6 as it is placed underneath the sensor. By use of the position detecting device 18, the position of the center of the wafer 6 with respect to the X-Y coordinates can be calculated in a well-known manner. Also, the adjustment of the position of the wafer 6 surface with respect to the Z direction (i.e. the height adjustment) as well as the correction of any tilt of the wafer 6 surface with respect to the plane containing the X and Y directions can be made at the prealignment position 17. The position of the center of the wafer 6 can be detected in various ways. For example, the wafer 6 conveyed to the prealignment position 17 may be moved, by the X-Y stage 3, across the prealignment position 17 in each of the X and Y directions. During such movement, the edges of the wafer 6 may be detected on the basis of output signals of the electrostatic capacitance type sensor of the position detecting device 18. Thus, from the information concerning the configuration of the wafer 6 and from the output signals of the X and Y position detectors 4a and 4b at the time of detection of the edges of the wafer 6, the position of the center of the wafer 6 can be determined by at the position calculator 5.

Figure 2:
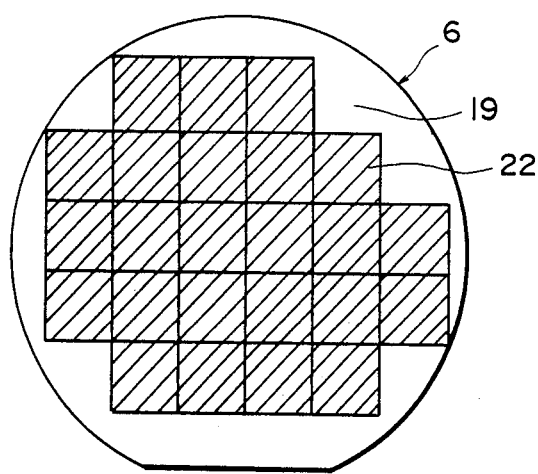
FIG. 2 is a schematic plan view of a wafer usable in the wafer prober of the FIG. 1 embodiment.
Figure 3:
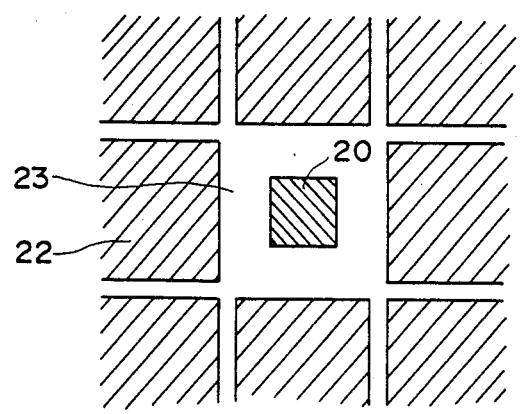
FIG. 3 is an enlarged view showing a portion of a wafer usable in the wafer prober of the FIG. 1 embodiment.

As schematically illustrated in FIG. 2, a plurality of integrated circuits (semiconductor chips) 22 are formed usually on the central part of a wafer 6 in a grid-like fashion. On an outer peripheral part of the wafer 6, surrounding the chip group, there is a marginal portion 19 (non-chip forming region) which is a region in which no chip is formed. Also, usually a wafer 6 has formed thereon a plurality of test chips (called "TEG", i.e. "test element group") which are usually defined among the actual chips 22. One such test chip is depicted at 20 in FIG. 3. Each test chip has a size smaller than the actual chip, as seen from FIG. 3. Around such a test chip 20, there is a marginal portion 23 which is also a non-chip forming region.

The probing process in the wafer prober of the present embodiment will now be described. For the best understanding, a description will be given of a case where the probe cards have just been changed in order to execute the probing operation on a different type of wafer.

A first wafer 6 which is to be probed first is placed on the chuck 7 (which is at the image recognizing position 8) by means of a handler, not shown. At this time, the wafer 6 is placed so that its orientation flat is roughly positioned with respect to a predetermined direction. Then, the wafer 6 is held using the chuck 7 by vacuum suction. Thereafter, the X-Y stage 3 is moved from the image recognizing position 8 to the prealignment position 17, where the measurement of the position of the wafer 6 as well as the adjustment of the height and the tilt of the wafer 6 surface are executed by use of the position detecting device 18.

Subsequently, the X-Y stage 3 is moved back to the image recognizing position 8. At the image recognizing position 8, the image recognizing device 9 is used in combination with the position detectors 4a and 4b so as to detect the above-described non-chip forming region (the marginal portion 19 or 23) on the wafer 6. The positional data concerning the non-chip forming region is applied to the position calculator 5.

Subsequently, the X-Y stage 3 is moved from the image recognizing position 8 to the probe test position 10, so as to place the non-chip forming region of the wafer 6 underneath the probing needles 21. The positional data concerning approximate positions of the probe needles 21 (more particularly, the tips of the needles) has been inputted into the position calculator 5. Actually, this is done at the time of insertion of the probe card 16 into the card holder 15. Also, the positional relation between the image recognizing position 8 and the probe test position 10 is predetermined. Therefore, by moving the X-Y stage 3 on the basis of the positional data concerning the probe needles 21 (needle tips) and the positional data concerning the non-chip forming region, the probing needles 21 and the non-chip forming region can be easily but sufficiently aligned with each other.

Subsequently, the θ-Z stage 2 is actuated to move the chuck 7 upwardly so that the tips of the probe needles 21 are press-contacted to the non-chip forming region of the wafer 6 at a suitable pressure sufficient to form traces or marks of the needle tips on the nonchip forming region of the wafer 6. Subsequently, the chuck 7 is moved downwardly. After this, X-Y stage 3 is moved again toward the image recognizing position 8 by a distance exactly corresponding to the distance through which the X-Y stage 3 has been moved from the image recognizing position 8 to the probe test position 10 for the formation of the traces of the needle tips. Of course, the direction of movement of the X-Y stage 3 to the image recognizing position 8 is opposite to that of the previous movement of the X-Y stage 3 toward the probe test position 10. After the X-Y stage 3 is moved back to the image recognizing position 8, the image recognizing device 9 is used so as to detect the positions of the traces of the needle tips by the image processing technique. Where the viewfield of the image recognizing device is sufficiently wide, all the traces of the needle tips formed on the wafer may be detected at the same time. If, on the other hand, the viewfield is not wide, the traces of the needle tips may be detected sequentially while sequentially moving the X-Y stage 3 and monitoring the output signals of the X and Y position detectors 4a and 4b.

The positional data concerning the traces of the needle tips on the wafer 6, obtained by the cooperation of the image recognizing device 9 and the position detectors 4a and 4b, is supplied to the position calculator 5. Thus, on the basis of the output signals from the image recognizing device 9 and the output signals from the position detectors 4a and 4b, the position calculator 5 determines, indirectly, the positions of the tips of the probing needles 21.

Figure 4A:
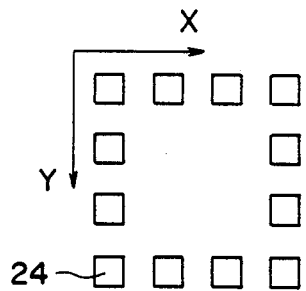
FIGS. 4A and 4B are schematic views, respectively, for explicating correction of the angular position of the probing needles (probe card), in accordance with the FIG. 1 embodiment.
Figure 4B:
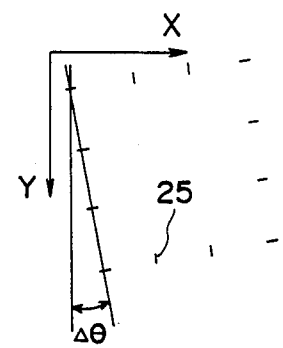

If, as shown in FIG. 4B, the orientation of the array of the traces (shown at 25) of the needle tips is inclined by an angle Δθ with respect to the orientation (X and Y directions) of arrayed electrode pads (shown at 24 in FIG. 4A) on the wafer 6, the position calculator 5 produces an output signal for the correction of the angular position of the probe card, the output signal being applied to the controller 14. In response to this angular position correcting signal, the controller 14 supplies a control signal to the driver 12 to rotationally move the probe ring 11, thereby to adjust the relative rotational position of the probing needles 21 and the electrode pads 24.

In the manner described above, the positions of the probing needles 21 are measured and the angular position of the probe card 16 is adjusted. Thereafter, the X-Y stage 3 is minutely moved relatively to the image recognizing position 8 so that a predetermined chip on the wafer 6 is placed underneath the image recognizing device 9. Then, the image recognition is executed to the electrode pads of a predetermined chip of the wafer 6 to detect their positions. The positional data obtained as a result of the image recognition which is supplied to the position calculator 5. Thus, on the basis of the output signals from the image recognizing device 9 and the output signals from the position detectors 4a and 4b, the position calculator 5 determines the positions of the electrode pads 24.

In this manner, the positions of the probe needles 21 (more particularly, the needle tips) and the positions of the electrode pads 24 are detected precisely. Thereafter, the X-Y stage 3 is moved from the image recognizing position 8 to the probe test position 10, with the amount of movement being corrected by suitable amounts ΔX and ΔY (in the X and Y directions), so that the electrode pads 24 are accurately positioned just below the tips of the probe needles 21, respectively. Thus, after the replacement of the probe card the alignment of the probing needles 21 and the electrode pads 24 of one of the chips (which is predetermined) on the wafer 6 is accomplished automatically.

After completion of the alignment, the examination of a first chip on the wafer 6 is initiated. Each time the examination of one chip is completed, the X-Y stage 3 is moved on the basis of the output signals from one of the the position detectors 4a and 4b, in the X and/or Y direction by an amount corresponding to the pitch of the arrayed chips on the wafer 6. In this manner, the examination can be made to all the chips on the wafer 6 sequentially. When the examination on all the chips of the wafer is completed, the wafer is unloaded, and the next wafer is placed on the chuck 7 and the examination is similarly, repeated. It is to be noted that, for this second wafer, the step of detecting the positions of the probing needles 21 (more particularly, the needle tips) may be omitted because they have already been detected accurately during the examination of the first wafer.

Figure 5:
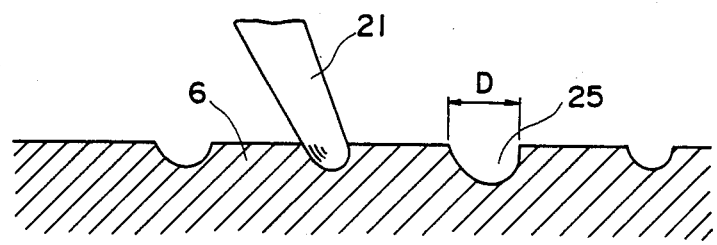
FIG. 5 is a section schematically showing the formation of traces of needle tips.

FIG. 5 schematically shows the manner of formation of the traces 25 of the needle tips when the probing needles 21 are press-contacted to the wafer 6. Usually, the traces of the needle tips formed on a wafer are elongated, as best seen in FIG. 4B. The size or length of each trace, as denoted at D in FIG. 5, corresponds to the magnitude of the pressing force of a probing needle 21 applied relatively to the wafer 6 surface. With a larger pressing force, a larger trace of a needle tip is formed. Accordingly, by measuring the size D of the trace 25, e.g., by the image processing technique, the appropriateness of the pressing force of the probing needle can be determined. Thus, on the basis of the data obtained by the measurement of the size D of the trace, the height of the chuck 7 can be adjusted automatically, as it is desired. Since the data for the adjustment of the height of the chuck 7 is obtainable directly from the traces of the needle tips actually formed on the wafer surface, the data itself is accurate so that the adjustment is attainable with a high reliability.

While the invention has been described with reference to the structures disclosed herein, it is not confined to the details set forth and this application is intended to cover such modifications or changes as may come within the purposes of the improvements or the scope of the following claims.

What is claimed is:

1. A wafer prober usable with a probe card having probing needles and a wafer having chips formed thereon, comprising:

pressing means for pressing the probing needles relative to a non-chip portion of the wafer in which portion no chip is formed, so that traces of tips of the probing needles are formed on the non-chip portion of the wafer;

detecting means for detecting the positional relation between electrode pads of a chip on the wafer and the traces of the needle tips formed on the nonchip portion of the wafer; and control means for controlling the positional relation between the electrode pads and the probing needles on the basis of the detection by said detecting means.

2. A wafer prober according to claim 1, wherein said pressing means includes a card holder for holding thereon the probe card at a first position, an X-Y stage movable between the first position and a second positon spaced from the first position by a predetermined distance, a wafer holder for holding the wafer, and a Z stage for moving the wafer holder relative to said X-Y stage so that the probing needles are presscontacted to the non-chip portion of the wafer.

3. A wafer prober according to claim 2, wherein said detecting means includes image recognizing means supported at the second position and calculating means for detecting the positional relation between the electrode pads and the traces of the needle tips on the basis of an imagewise signal produced by said image recognizing means.

4. A wafer prober according to claim 3, wherein said control means includes driving means operable to rotationally move said card holder in accordance with the detection by said calculating means.

5. A method, usable in a wafer prober, for aligning probing needles of a probe card with a chip on a wafer, said method comprising the steps of:

pressing the probing needles relative to a non-chip portion of a wafer in which portion no chip is formed, so that traces of tips of the probing needles are formed on the non-chip portion of the wafer;

detecting the positional relation between electrode pads of the chip on the wafer and the traces of the needle tips formed on the non-chip portion of the wafer; and controlling the positional relation between the probing needles of the probe card and the electrode pads of the chip, on the basis of the detection.

6. A method according to claim 5, wherein the non-chip portion of the wafer is a marginal portion surrounding chips formed on the wafer in a grid-like fashion.

7. A method according to claim 5, wherein the non-chip portion of the wafer is a marginal portion surrounding a test chip which is defined between chips on the wafer.

8. A method, usable in a wafer prober, for aligning probing needles of a probe card with a chip on a wafer, said method comprising the steps of:

pressing the probing needles relative to a non-chip portion of a wafer in which portion no chip is formed, so that traces of tips of the probing needles are formed on the non-chip portion of the wafer;

detecting the positional relation between electrode pads of the chip on the wafer and the traces of the needle tips formed on the non-chip portion of the wafer;

controlling the positional relation between the probing needles of the probe card and the electrode pads of the chip on the basis of the detection; and measuring the size of at least one of the traces of the needle tips and checking, on the basis of the measurement, the pressing force of the probing needles applied relative to the non-chip portion of the wafer.

* * * * *